US009692403B2

(12) United States Patent
Elbadry

(10) Patent No.: US 9,692,403 B2
(45) Date of Patent: Jun. 27, 2017

(54) DIGITAL CLOCK-DUTY-CYCLE CORRECTION

(71) Applicant: TEXAS INSTRUMENTS INCORPORATED, Dallas, TX (US)

(72) Inventor: Mohammad Elbadry, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/927,929

(22) Filed: Oct. 30, 2015

(65) Prior Publication Data
US 2017/0126220 A1 May 4, 2017

(51) Int. Cl.
H03K 3/017 (2006.01)
H03K 7/08 (2006.01)

(52) U.S. Cl.
CPC ..................... H03K 7/08 (2013.01)

(58) Field of Classification Search
CPC ............. H03K 3/017; H03K 7/08; H03K 9/08
USPC .......................... 327/172, 175, 176
See application file for complete search history.

(56) References Cited

U.S. PATENT DOCUMENTS 5,757,218 A * 5/1998 Blum ....................... H03K 5/05
327/172
5,963,071 A * 10/1999 Dowlatabadi ...... H03K 5/00006
327/116
7,279,946 B2 * 10/2007 Minzoni ................. H03L 7/087
327/149
7,839,195 B1 * 11/2010 Feng ...................... H03K 5/156
327/147
2006/0001462 A1 * 1/2006 Kim ...................... H03K 5/1565
327/144
2007/0086267 A1 * 4/2007 Kwak ....................... G11C 7/02
365/233.1
2007/0216457 A1 * 9/2007 Agarwal .............. H03K 5/1565
327/175
2009/0231006 A1 * 9/2009 Jang ....................... H03K 5/151
327/175
2010/0097112 A1 * 4/2010 Panditd ................ H03K 5/1565
327/175
2010/0117702 A1 * 5/2010 Jang ..................... H03K 5/1565
327/175
2013/0207701 A1 * 8/2013 Kitagawa ................. H03K 5/06
327/158

* cited by examiner

Primary Examiner — William Hernandez
(74) Attorney, Agent, or Firm — John R. Pessetto; Charles A. Brill; Frank D. Cimino

(57) ABSTRACT

A clock generator includes a duty cycle correction circuit. The duty cycle correction circuit includes a duty cycle detector. The duty cycle detector, includes a first programmable delay element and a controller. The first programmable delay element is configured to delay a clock signal. The controller is configured to vary an amount of delay applied to the clock signal by the first programmable delay element, and to apply a delayed version of the clock signal, provided by the first programmable delay element, to locate an edge of a different version of the clock signal and measure time during which the different version of the clock is high. The controller is also configured to generate a digital value that indicates an amount of adjustment to apply to a duty cycle of the clock signal based on measured time during which the different version of the clock is high.

10 Claims, 5 Drawing Sheets

DIGITAL CLOCK-DUTY-CYCLE CORRECTION

BACKGROUND

Clock signals are commonly used in many electronics circuits and for various purposes. For example, dock signals are used to trigger synchronous circuits (e.g., flip-flops) in digital circuits such as processors, memory devices, and so on. Clock signals may be generated with various types of oscillators and supporting circuitry. A dock signal continually transitions between two levels (e.g., logic high and logic low levels). The dock signal has a duty cycle that is determined by the time duration at logic high and the time duration at logic low.

The duty cycle of a dock signal is generally stated as a percentage. For example, a dock signal that has a pattern of 80% high and 20% low has an 80% duty cycle. In some applications, it may desirable that the duty cycle of a dock signal be a 50% cycle, where a 50% duty cycle has a waveform with equal high and low portions. For example, circuits that rely on both dock edges may not function properly if a 50% duty cycle dock is not applied to the circuits. Unfortunately, many types of circuits create duty cycle distortion, and it can be difficult to maintain a 50% duty cycle.

SUMMARY

An apparatus and method for controlling the duty cycle of a clock are disclosed herein. In some embodiments, a clock generator includes a duty cycle correction circuit. The duty cycle correction circuit includes a duty cycle detector. The duty cycle detector, includes a first programmable delay element and a controller. The first programmable delay element is configured to delay a clock signal. The controller is configured to vary an amount of delay applied to the clock signal by the first programmable delay element, and to apply a delayed version of the clock signal, provided by the first programmable delay element, to locate an edge of a different version of the clock signal and measure time during which the different version of the clock is high. The controller is also configured to generate a digital value that indicates an amount of adjustment to apply to a duty cycle of the clock signal based on measured time during which the different version of the clock is high.

In other embodiments, a clock duty cycle correction circuit includes a duty cycle detector and a duty cycle adjustor. The duty cycle detector includes a detector delay element and a controller. The detector delay element is configured to delay a corrected clock signal by a programmable time. The controller is configured to vary an amount of delay applied to the corrected clock signal by the detector delay element, to measure duty cycle of the corrected clock signal based on a delayed version of the corrected clock signal produced by the detector delay element, and to generate a digital value that indicates an amount of adjustment to apply to the duty cycle of the corrected clock signal based on a measured duty cycle of the corrected clock signal. The duty cycle adjustor is configured to change the duty cycle of the corrected clock signal responsive to a change in the digital value.

In further embodiments, a method for correcting duty cycle of a clock signal includes measuring a duration of a high portion of a corrected clock signal by varying a delay applied to the corrected clock signal, and measuring a duration of a low portion of the corrected clock signal by varying the delay applied to the corrected clock signal. The duration of the high portion of the corrected clock signal is compared to the duration of the low portion of the corrected clock signal to determine which of the high portion and the low portion is longer. The duty cycle of the corrected clock signal is adjusted by changing a digital value that controls the duty cycle of the corrected clock signal to reduce the duration of a portion of the corrected clock signal determined to be longer, and applying the digital value to change the duty cycle of the corrected clock signal.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be based on Y and any number of other factors.

Conventional duty-cycle correction circuits are implemented as analog loops. While such implementations may be effective for correcting the duty cycle of continuous clock signals, burst mode applications present significant problems because the analog loop must settle every time a burst of clocks is generated. The requisite state of the loop for producing a 50% duty cycle is lost when the input clock is removed, requiring a long settling period every time the input clock is re-applied. Additionally, because continuous clock generation is required to maintain a 50% duty cycle, the power consumption of the duty cycle correction circuit and the system applying duty cycle correction are also increased.

Embodiments of the duty cycle correction circuit disclosed herein provide a reduced settling time for duty cycle correction in burst mode applications, and may also reduce overall cost by reducing the size of passives needed for circuit implementation. In the duty cycle correction circuit of the present disclosure, the feedback path is implemented in the digital domain (instead of analog). At system start-up, after an input clock is provided, the duty cycle correction circuit is allowed to settle to the desired accuracy. A delay generation value provided to a variable delay element at the end of settling is stored. If the clock is removed and then supplied again at a later time, the loop will start from the previously stored delay generation value allowing a faster settling time. Moreover, once the duty cycle correction circuit has settled, portions of the circuit that determine and change clock duty cycle can be turned off, reducing power consumption.

Figure 1:
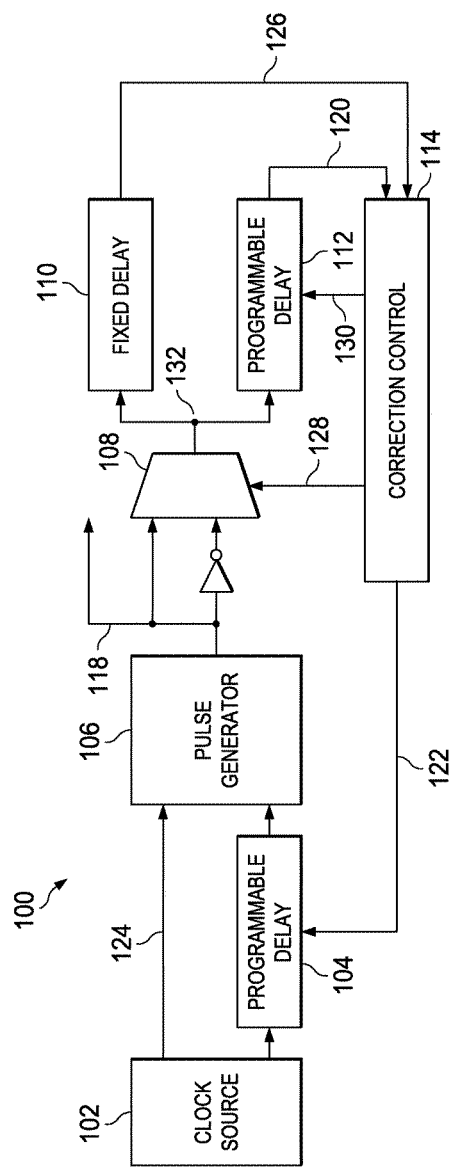
FIG. 1 shows a block diagram of a clock duty cycle correction circuit in accordance with various embodiments.

FIG. 1 shows a block diagram of a clock duty cycle correction circuit (DCC) 100 in accordance with various embodiments. The DCC circuit 100 includes a clock source 102, programmable delays 104 and 112, a pulse generator 106, fixed delay 110, a clock multiplexer 108, and correction control logic 114. The clock source 102 may be an oscillator of any of various types. The duty cycle of the clock signal 124 provided by the clock source 102 may not be 50%. The clock source 102 provides clock signal 124 to the programmable delay 104 and the pulse generator 106. The programmable delay 104 delays the clock signal 124 by a time that varies and is controllable by a value received from the correction control logic 114. In some embodiments, the programmable delay 104 may include a digital-to-analog converter (DAC) that converts a digital value 122 received from the correction control logic 114 to an analog signal (e.g., a voltage or current). The programmable delay 104 may vary the delay applied to the clock signal 124 as a function of the analog signal. For example, capacitance that affects propagation of the clock signal 124 through the programmable delay 104 may be varied as a function of the analog signal. Some embodiments of the programmable delay 104 may vary delay applied to the clock signal 124 based on the digital value 122 received from the correction control logic 114 in a different manner.

The pulse generator 106 generates a corrected clock signal 118 having the frequency of the clock signal 124 received from the clock source 102, and a duty cycle determined by the digital value 122 provided by the correction control logic 114. In some embodiments, the duty cycle of the corrected clock signal 118 is determined by the delayed clock signal received from the programmable delay 104. For example, a rising edge of the corrected clock signal 118 may be triggered by a rising edge of the clock signal 124 received from the clock source 102, and a falling edge of the corrected clock signal 118 may be triggered by a rising edge of the delayed clock signal received from the programmable delay 104. Thus, the duty cycle of the corrected clock signal 118 may be changed by changing the delay applied to the clock signal 124 by the programmable delay 104.

The clock multiplexer 108, programmable delay 112, fixed delay 110, and correction control logic 114 operate as a duty cycle detector to determine whether the duty cycle of the corrected clock signal 118 is greater than or less than 50%. The multiplexer 108 selectably routes either an inverted version or a non-inverted version of the corrected clock signal 118 to the fixed delay 110 and the programmable delay 112. The correction control logic 114 provides control signal 128 to the clock multiplexer 108 to select which of the inverted and non-inverted version of the corrected clock signal 118 is to be routed to the delays 110 and 112.

The correction control logic 114 is a controller that provides control signals 130 to the programmable delay 112, control signals 128 to the clock multiplexer 108, and digital value 122 to the programmable delay 104. The control signals 130 specify an amount of delay to be applied to the clock signal 132 output by the multiplexer 108 to produce delayed clock 120. The fixed delay 110 applies a predetermined amount of delay to the clock signal 132 to produce delayed clock 126. In some embodiments, the fixed delay 110 provides an amount of delay that is equivalent to the minimum delay provided by the programmable delay 112. The delayed clock signals 120 and 126, generated by the delays 112 and 110 respectively, are provided to the correction logic 114. The correction control logic 114 effectively compares or otherwise applies the delayed clock signals 120 and 126 to measure the duration of a high portion of the clock signal 132, which is a selected polarity of the corrected clock signal 118. For example, the correction control logic 114 may apply the delayed clock signal 120 as a sampling clock to sample the delayed clock 126. If the rising edge of the sampling clock is used to sample the delayed clock 126, then the correction control logic 114 may incrementally increase the delay applied by the programmable delay 112 until the result of sampling indicates that the sampling edge (e.g., the rising edge) of the delayed clock 120 has been delayed just past the falling edge of the delayed clock 126. That is, the correction control logic 114 may incrementally increase the delay applied by the programmable delay 112 until the rising edge of the sampling clock is moved past the falling edge of the delayed clock 126. In this way the duration of the high portion of the delayed clock 126 may be measured as the amount of delay provided by the programmable delay 112 to move the sampling clock to the falling edge of the delayed clock 126.

Figure 2:
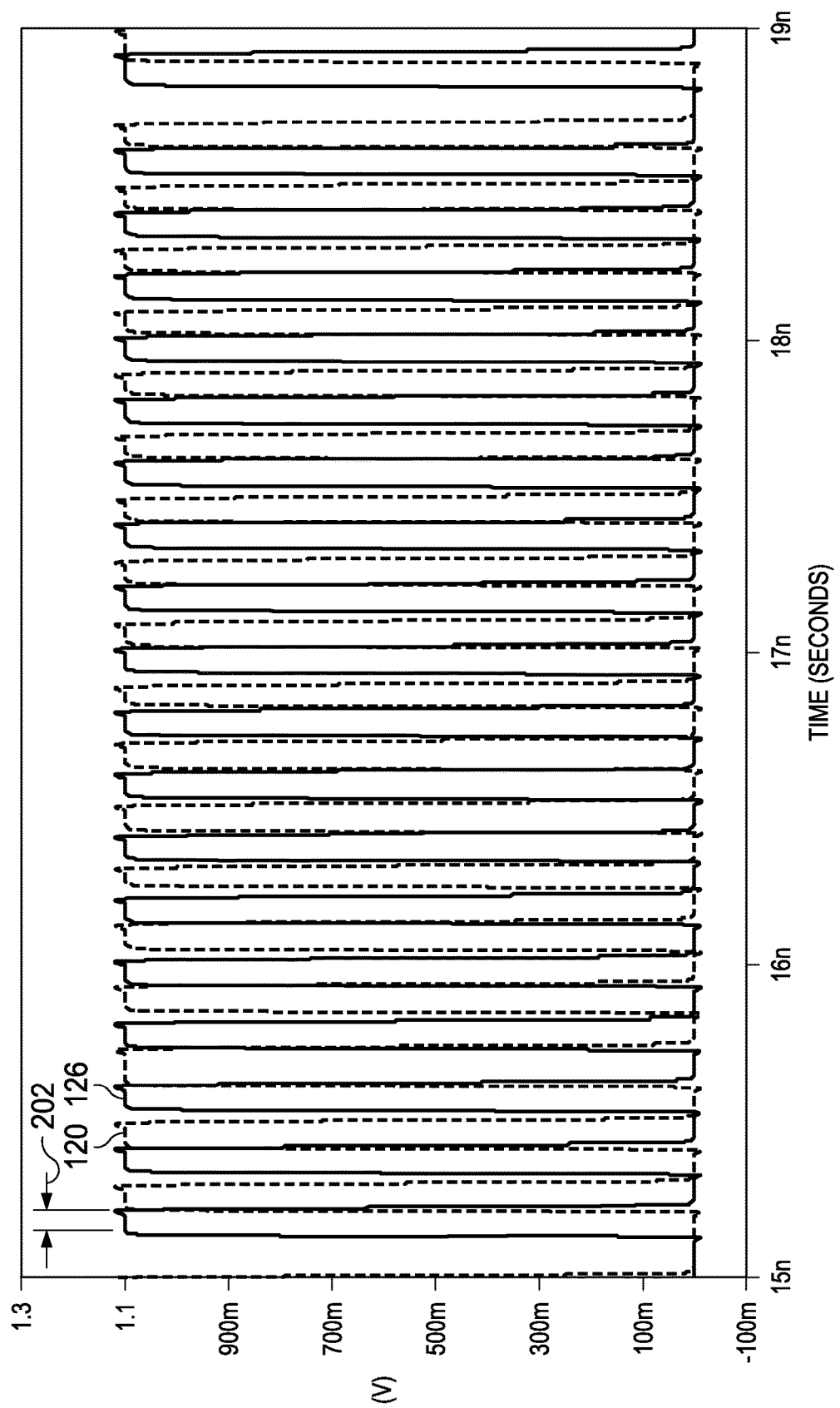
FIG. 2 shows an example of clock signals generated in a clock duty cycle correction circuit in accordance with various embodiments.

FIG. 2 shows an example of clock signals 120 and 126 generated in the DCC circuit 100. The correction control logic 114 adjusts the delay applied by the programmable delay 112 such that the rising edge of the clock 120 is coincident with the falling edge of the clock 126 to measure the portion 202 of the clock 120. The portion 202 may be the high or low portion of the corrected clock signal 118 as determined by how the clock multiplexer 108 is set by the correction control logic 114.

The correction control logic 114 may apply various adjustment methods to change the delay applied by the programmable delay 112 for measurement of the high and low portions of the corrected clock signal 118. For example, in one embodiment, the correction control logic 114 may incrementally change the delay applied by the programmable delay 112. In other embodiments, the correction control logic 114 may apply a successive approximation technique to more rapidly adjust the delay applied by the programmable delay 112. To facilitate use of a successive approximation technique for adjustment of duty cycle, in at least some embodiments, the maximum delay specified by the digital value of 112 may be greater than 1 period of the clock 124 but less than 2 periods of the clock 124.

To determine whether the duty cycle of the corrected clock signal 118 should be increased or decreased, the correction control logic 114 sets the clock multiplexer 108 to provide the non-inverted version of the corrected clock signal 118 to the delays 110 and 112 and adjusts the delay applied by the programmable delay 112, as explained above, to measure the duration of the high portion of the corrected clock signal 118. After measuring the duration of the high portion of the corrected clock signal 118, the correction control logic 114 sets the clock multiplexer 108 to provide the inverted version of the corrected clock signal 118 to the delays 110 and 112 and adjusts the delay applied by the programmable delay 112, as explained above, to measure the duration of the low portion of the corrected clock signal 118.

The correction control logic 114 compares the measured durations of the high and low portions of corrected clock signal 118 to determine which portion (high or low) of the corrected clock signal 118 should be increased in duration, and similarly, which portion of the corrected clock should be decreased in duration. In general, the duration of the longer portion of the corrected clock signal 118 will be decreased, and the duration of the shorter portion of the corrected clock will be increased.

The correction control logic 114 changes the duty cycle of the corrected clock signal 118 by changing the delay applied to the clock signal 124 by the programmable delay 104. If comparison of the measured durations of the high and low portions of the corrected clock signal 118 indicates that the "high" portion of the corrected clock signal 118 is longer than the "low" portion of the corrected clock signal 118, then the correction control logic 114 may adjust the digital value 122 to change the delay applied in the programmable delay 104 such that the duration of the "high" portion of the corrected clock signal 118 is decreased and the duration of the "low" portion of the corrected clock signal 118 is increased. Similarly, if comparison of the measured durations of the high and low portions of the corrected clock signal 118 indicates that the "low" portion of the corrected clock signal 118 is longer than the "high" portion of the corrected clock signal 118, then the correction control logic 114 may adjust the digital value 122 to change the delay applied in the programmable delay 104 such that the duration of the "low" portion of the corrected clock signal 118 is decreased and the duration of the "high" portion of the corrected clock signal 118 is increased.

The correction control logic 114 may apply various adjustment methods to change the duty cycle of the corrected clock signal 118. For example, in one embodiment, the correction control logic 114 may increment or decrement the digital value 122 once per duty cycle measurement interval to move the corrected clock signal 118 towards 50% duty cycle. In other embodiments, the correction control logic 114 may apply a successive approximation technique to more rapidly adjust the digital value 122 to achieve a 50% duty cycle.

Figure 3:
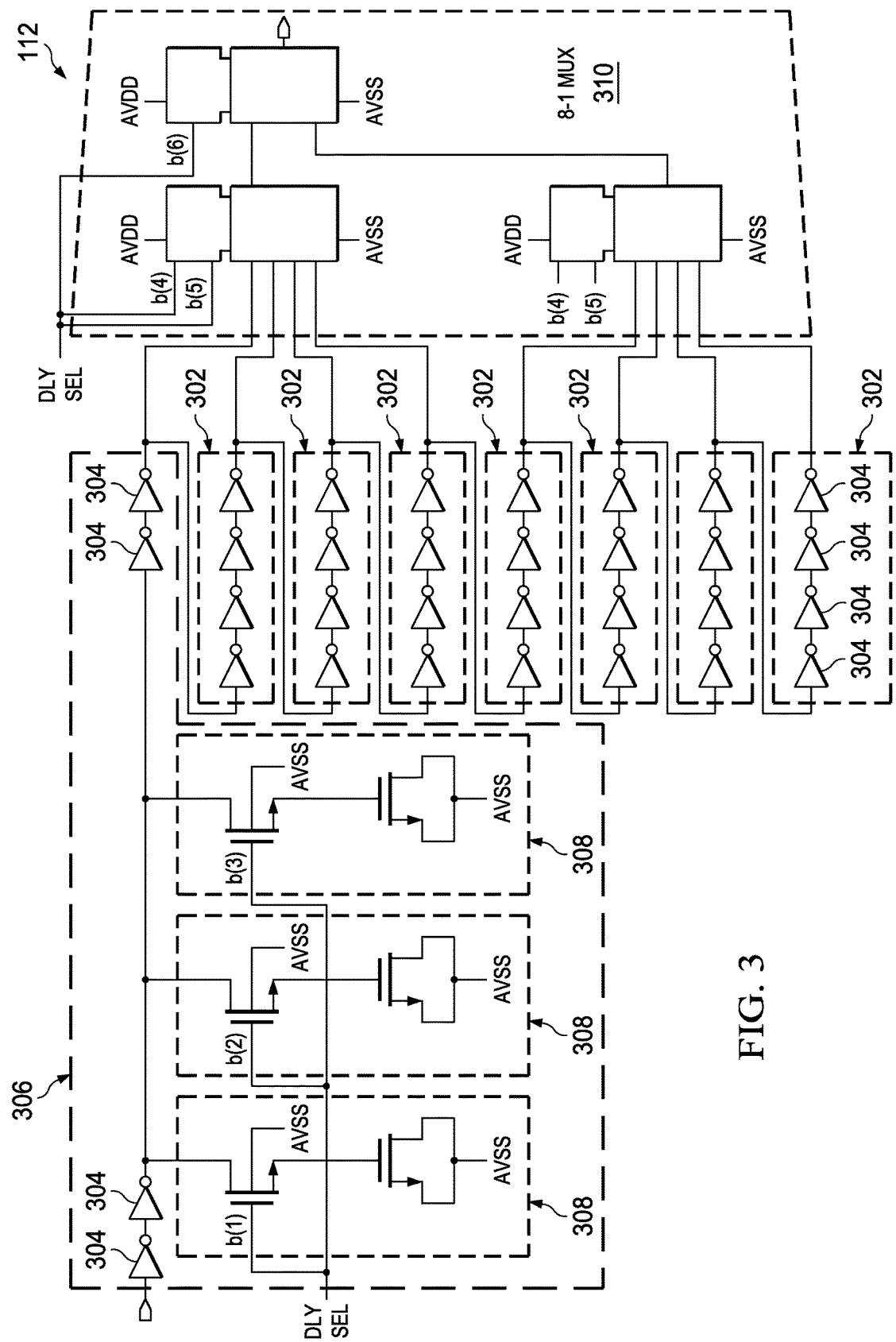
FIG. 3 shows a schematic diagram of a programmable delay element suitable for use in a clock duty cycle correction circuit in accordance with various embodiments.

FIG. 3 shows a schematic diagram of an embodiment of the programmable delay element 112 suitable for use in the DCC circuit 100. The programmable delay element 112 includes an initial delay section 306 and seven delay sections 302 connected in sequence, an 8-to-1 multiplexer 310. The initial delay section 306 includes three switchable metal oxide semiconductor capacitors 308. The switchable capacitors 308 may be binary-weighted and individually selectable to provide fine delay adjustment by loading an inverter 304 of the initial delay section 306. The delay sections 302 and 306 provide coarse delay. The outputs of the delay sections 302 and 306 are provided to and are selectable via the 8-to-1 multiplexer 310. Other embodiments of the programmable delay element 112 may include a different number of delay sections or provide programmable delay in a different manner.

Figure 4:
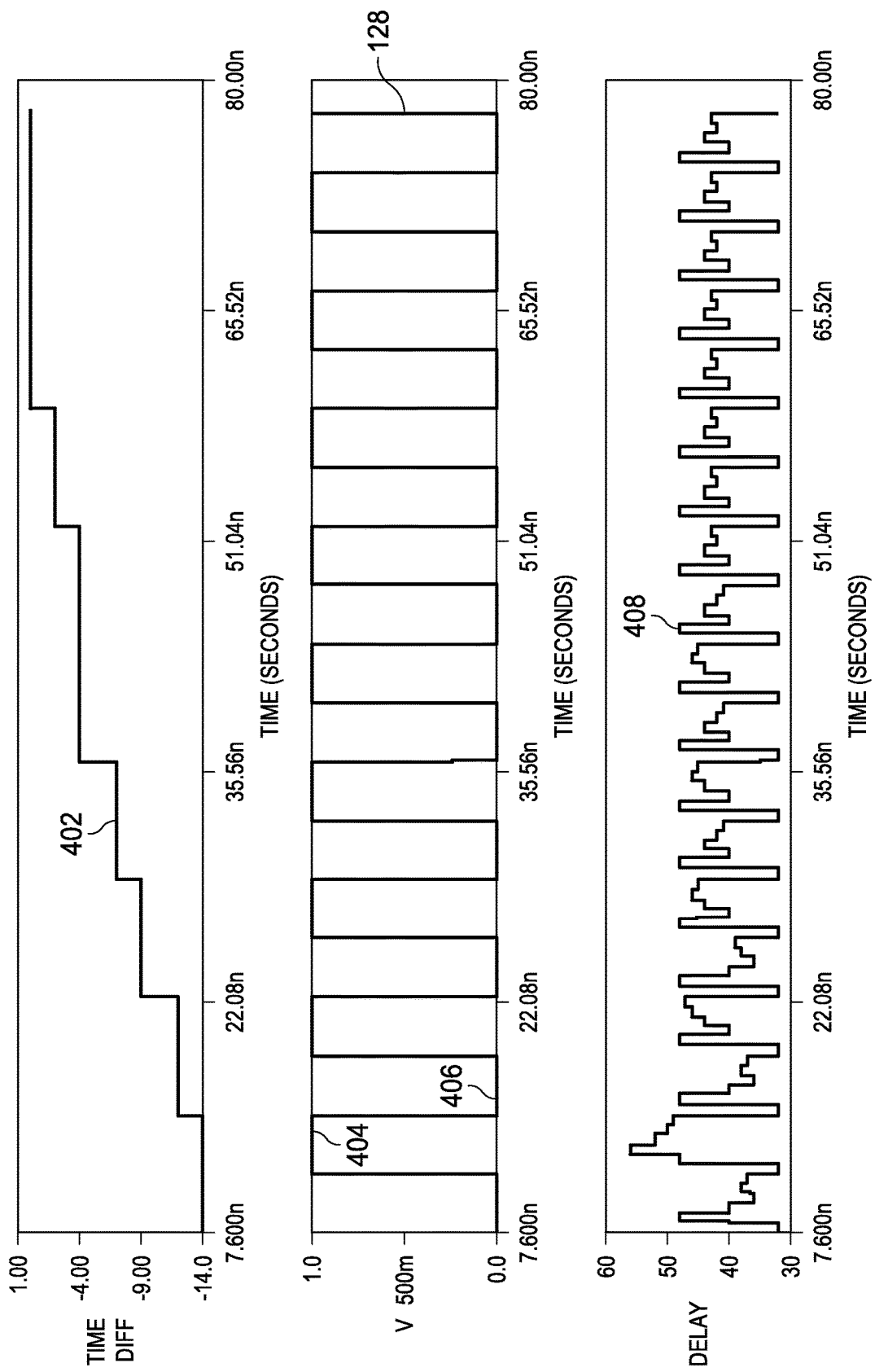
FIG. 4 shows an example of signals produced during operation of a clock duty cycle in accordance with various embodiments.

FIG. 4 shows an example of signals produced during operation of the DCC circuit 100. The correction control logic 114 sets the multiplexer control signal 128 low 406 to measure a first portion (e.g., a low portion of the corrected clock signal 118, and sets the multiplexer control signal 128 high 404 to measure a second portion (e.g., a high portion of the corrected clock signal 118. On completion of each cycle of measurement of the high and low portions of the corrected clock signal 118, the digital value 122 is changed to adjust the delay applied in the programmable delay 104 and to, in turn, adjust the duty cycle of corrected clock signal 118. Signal 402 show that the difference in duration of the high and low portions of the corrected clock signal 118 is reduced as the duty cycle is corrected to 50% over a number of measurement cycles. The signal 408 represents the change in delay applied by the programmable delay 112 via the control signal 130 generated by the correction control logic 114 using a successive approximation technique during each measurement of the high and low portions of the corrected clock signal 118. Using a successive approximation technique, for N-bits of delay in the programmable delay 104, each measurement cycle includes N measurement clock cycles. To provide enough time to update the measurement loop, one measurement cycle can be made up of M input clock cycles. Accordingly, one measurement cycle may include M×N input clock cycles. In the implementation illustrated in FIG. 4, M is set to 3, and N, the number of bits used for delay, is set to 6.

Figure 5:
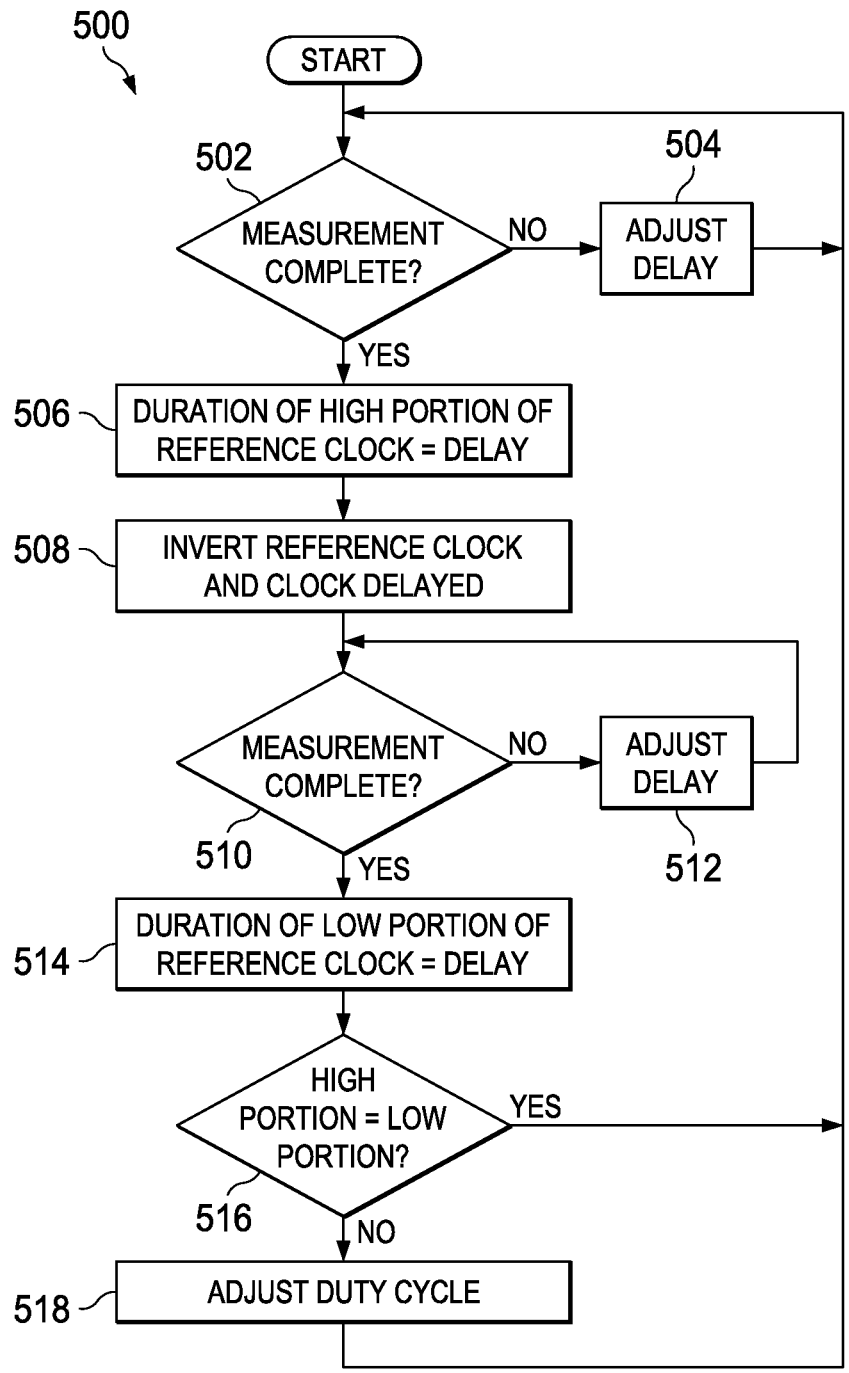
FIG. 5 shows a flow diagram for a method for clock duty cycle correction in accordance with various embodiments.

FIG. 5 shows a flow diagram for a method for clock duty cycle correction in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 500, as well as other operations described herein, can be implemented in the DCC circuit 100.

In blocks 502-506, the DCC circuit 100 is measuring the duration of a first portion of the corrected clock signal 118. For example, the DCC circuit 100 may be measuring duration of a high portion of the corrected clock signal 118. In block 502, the correction control logic 114 has set the clock multiplexer 108 to route the selected phase of the corrected clock signal 118 (e.g., the non-inverted version of the clock signal 118) to the delay elements 110, 112, and set the delay applied in the programmable delay element 112 to an initial delay value. If the correction control logic 114 is using a successive approximation technique, then the delay may be set to a median value. If the correction control logic 114 is using an incremental approach, then the delay may be set to an initial value (e.g., a minimum value).

In block 502, the correction control logic 114 determines whether the measurement is complete. Determination of measurement completion may vary with the delay adjustment technique applied by the correction control logic 114. If an incremental approach to delay adjustment is applied, then measurement may be complete following a delay adjustment that moves an edge (e.g., a sampling edge) of the delayed clock 120 to or past an edge of the delayed clock 126 that defines and end of the portion of the clock being measured. If a successive approximation approach to delay adjustment is applied, then measurement may be complete following application of all of the delay elements provided by the programmable delay 112.

If measurement is not complete, then, in block 504, the correction control logic 504 changes the delay applied by the programmable delay 112. The change in delay may vary with the delay adjustment technique applied by the correction control logic 114. If an incremental approach to delay adjustment is applied, then a value of delay incrementally higher than the current delay value (i.e., a next higher value of delay) may be applied. If a successive approximation approach to delay adjustment is applied, then delay applied in the programmable delay 112 may be adjusted using a binary search that changes the delay applied based on whether the currently applied delay has moved the edge of the delayed clock 120 past the edge of the delayed clock 126.

If the measurement is complete, then, in block 506, the delay applied in the programmable delay element 112 at measurement completion may be deemed the duration of the portion of the corrected clock 118 being measured.

In block 508, the correction control logic 114 sets the clock multiplexer 108 to provide a different selected phase of the corrected clock signal 118 (e.g., the inverted version of the clock signal 118) to the delay elements 110, 112, and sets the delay applied in the programmable delay element 112 to the initial delay value.

In blocks 510-514, the DCC circuit 100 is measuring the duration of a second portion of the corrected clock signal 118. For example, the DCC circuit 100 may be measuring duration of a low portion of the corrected clock signal 118. In block 510, the correction control logic 114 determines whether the measurement is complete. Determination of measurement completion may vary with the delay adjustment technique applied by the correction control logic 114. If an incremental approach to delay adjustment is applied, then measurement may be complete following a delay adjustment that moves an edge (e.g., a sampling edge) of the delayed clock 120 to or past an edge of the delayed clock 126. If a successive approximation approach to delay adjustment is applied, then measurement may be complete following application of all of the delay elements provided by the programmable delay 112.

If measurement is not complete, then, in block 512, the correction control logic 504 changes the delay applied by the programmable delay 112. The change in delay may vary with the delay adjustment approach applied by the correction control logic 114. If an incremental approach to delay adjustment is applied, then a value of delay incrementally higher than the current delay value (i.e., a next higher value of delay) may be applied. If a successive approximation approach to delay adjustment is applied, then delay applied in the programmable delay 112 may be adjusted using a binary search that changes the delay applied based on whether the currently applied delay moves the edge of the delayed clock 120 past the edge of the delayed clock 126.

If the measurement is complete, then, in block 514, the delay applied in the programmable delay element 112 at measurement completion may be deemed the duration of the portion of the corrected clock 118 being measured.

Having completed measurement of both the high and low portions of the corrected clock signal 118, the correction control logic 114, in block 516, compares the measurements to determine which of the high and low portions of the corrected clock signal 118 is of longer duration. If the high and low portions of the corrected clock signal 118 are of equal duration, then no adjustment to the duty cycle of the corrected clock is made and the digital value 122 is not changed. If the duration of one of the high or low portions of the corrected clock signal 118 is longer than the duration of the other, then in block 518, the correction control logic 114 changes the digital value 518, which in turn change the delay applied to the clock signal 124 in the programmable delay 104 and changes the duty cycle of the corrected clock signal 118 in the pulse generator 106. Generally, the digital value 122 will be adjusted such that the duration of the longer portion of the corrected clock signal 118 is reduced, and the duration of the shorter portion of the corrected clock signal is increased to move the duty cycle of the corrected clock signal 118 towards 50%.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A clock generator, comprising:
   a duty cycle correction circuit, comprising:
      a duty cycle detector, comprising:
         a first programmable delay element configured to delay a clock signal; and
         a controller configured to:
            vary an amount of delay applied to the clock signal by the first programmable delay element;
            apply a delayed version of the clock signal, provided by the first programmable delay element, to locate an edge of a different version of the clock signal and measure the time during which the different version of the clock signal is high; and
            generate a digital value that indicates an amount of adjustment to apply to a duty cycle of the clock signal based on the measured time during which the different version of the clock signal is high;
   wherein the controller is configured to:
   apply the delayed version of the clock signal, provided by the first programmable delay element, to locate an edge of the different version of the clock signal and measure the time during which the different version of the clock signal is low;
   compare the time during which the different version of the clock signal is low to the time during which the different version of the clock signal is high; and
   generate the digital value to reduce duration of a longer of the time during which the different version of the clock signal is low and the time during which the different version of the clock signal is high;
      a multiplexer configured to selectably route a non-inverted version of the clock signal and an inverted version of the clock signal to the first programmable delay element for measurement of the time during which the different version of the clock signal is high and the time during which the different version of the clock signal is low.

2. A clock generator, comprising:
   a duty cycle correction circuit, comprising:
      a duty cycle detector, comprising:
         a first programmable delay element configured to delay a clock signal; and
         a controller configured to:
            vary an amount of delay applied to the clock signal by the first programmable delay element;
            apply a delayed version of the clock signal, provided by the first programmable delay element, to locate an edge of a different version of the clock signal and measure the time during which the different version of the clock signal is high; and
      generate a digital value that indicates an amount of adjustment to apply to a duty cycle of the clock signal based on the measured time during which the different version of the clock signal is high; and
         a fixed delay element configured to delay the clock signal by a fixed predetermined amount to produce the different version of the clock signal.

3. The clock generator of claim 2, wherein the fixed predetermined amount is equal to a minimum amount of delay generated by the first programmable delay element.

4. A clock generator, comprising:
   a duty cycle correction circuit, comprising:
      a duty cycle detector, comprising:
         a first programmable delay element configured to delay a clock signal; and
         a controller configured to:
            vary an amount of delay applied to the clock signal by the first programmable delay element;
            apply a delayed version of the clock signal, provided by the first programmable delay element, to locate an edge of a different version of the clock signal and measure the time during which the different version of the clock signal is high; and
   generate a digital value that indicates an amount of adjustment to apply to a duty cycle of the clock signal based on the measured time during which the different version of the clock signal is high; and
      wherein the controller is configured to apply a successive approximation technique to vary an amount of delay applied to the clock signal by the first programmable delay element for measuring time during which the different version of the clock signal is high.

5. A clock generator, comprising:
   a duty cycle correction circuit, comprising:
      a duty cycle detector, comprising:
         a first programmable delay element configured to delay a clock signal; and
         a controller configured to:
            vary an amount of delay applied to the clock signal by the first programmable delay element;
            apply a delayed version of the clock signal, provided by the first programmable delay element, to locate an edge of a different version of the clock signal and measure the time during which the different version of the clock signal is high; and
   generate a digital value that indicates an amount of adjustment to apply to a duty cycle of the clock signal based on the measured time during which the different version of the clock signal is high;
      a second programmable delay element coupled to the controller; and
      a pulse width adjuster coupled to the second programmable delay element;
      wherein the second programmable delay element is configured to delay a reference clock based on the digital value, and the pulse width adjuster is configured to set the duty cycle of the clock signal based on a delayed version of the reference clock provided by the second programmable delay element.

6. A clock duty cycle correction circuit comprising:
   a duty cycle detector, comprising:
      a detector delay element configured to delay a corrected clock signal by a programmable time;
      a controller configured to:
         vary an amount of delay applied to the corrected clock signal by the detector delay element; and
         measure the duty cycle of the corrected clock signal based on a delayed version of the corrected clock signal produced by the detector delay element; and
         generate a digital value that indicates an amount of adjustment to apply to the duty cycle of the corrected clock signal based on a measured duty cycle of the corrected clock signal; and
   a duty cycle adjustor configured to change the duty cycle of the corrected clock signal responsive to a change in the digital value;
      wherein the controller is configured to apply a delayed version of the clock signal, provided by the detector programmable delay element, to locate an edge of a different version of the clock signal and measure time during which the different version of the clock is high; and
      wherein the duty cycle detector comprises a fixed delay element configured to delay the corrected clock signal by a fixed predetermined amount to produce the different version of the clock signal.

7. The clock duty cycle correction circuit of claim 6, wherein the fixed predetermined amount is equal to a minimum amount of delay generated by the detector programmable delay element.

8. A clock duty cycle correction circuit comprising:
   a duty cycle detector, comprising:
      a detector delay element configured to delay a corrected clock signal by a programmable time;
      a controller configured to:
         vary an amount of delay applied to the corrected clock signal by the detector delay element; and
         measure the duty cycle of the corrected clock signal based on a delayed version of the corrected clock signal produced by the detector delay element; and
         generate a digital value that indicates an amount of adjustment to apply to the duty cycle of the corrected clock signal based on a measured duty cycle of the corrected clock signal; and
   a duty cycle adjustor configured to change the duty cycle of the corrected clock signal responsive to a change in the digital value;
      wherein the duty cycle detector comprises a multiplexer configured to selectably route a non-inverted version of the corrected clock signal and an inverted version of the corrected clock signal to the detector programmable delay element for measurement of a time during which the corrected clock signal is high and a time during which the corrected clock signal is low.

9. A clock duty cycle correction circuit comprising:
   a duty cycle detector, comprising:
      a detector delay element configured to delay a corrected clock signal by a programmable time;
      a controller configured to:
         vary an amount of delay applied to the corrected clock signal by the detector delay element; and
         measure the duty cycle of the corrected clock signal based on a delayed version of the corrected clock signal produced by the detector delay element; and
         generate a digital value that indicates an amount of adjustment to apply to the duty cycle of the corrected clock signal based on a measured duty cycle of the corrected clock signal; and
   a duty cycle adjustor configured to change the duty cycle of the corrected clock signal responsive to a change in the digital value;
      wherein the controller is configured to apply a successive approximation technique to vary the programmable time of delay applied to the corrected clock signal by the detector programmable delay element for measuring the duty cycle of the corrected clock signal.

10. A clock duty cycle correction circuit comprising:
a duty cycle detector, comprising:
- a detector delay element configured to delay a corrected clock signal by a programmable time;
- a controller configured to:
  - vary an amount of delay applied to the corrected clock signal by the detector delay element; and
  - measure the duty cycle of the corrected clock signal based on a delayed version of the corrected clock signal produced by the detector delay element; and
  - generate a digital value that indicates an amount of adjustment to apply to the duty cycle of the corrected clock signal based on a measured duty cycle of the corrected clock signal; and a duty cycle adjustor configured to change the duty cycle of the corrected clock signal responsive to a change in the digital value;

wherein the duty cycle adjustor comprises:
- an adjustor programmable delay element; and
- a pulse width adjuster coupled to the adjustor programmable delay element;
- wherein the adjustor programmable delay element is configured to delay a reference clock based on the digital value, and the pulse width adjuster is configured to set the duty cycle of the corrected clock signal based on a delayed version of the reference clock provided by the adjustor programmable delay element.

* * * * *